(12) United States Patent
Tay et al.

(10) Patent No.: US 7,842,607 B2
(45) Date of Patent: Nov. 30, 2010

(54) SEMICONDUCTOR DEVICE AND METHOD OF PROVIDING A THERMAL DISSIPATION PATH THROUGH RDL AND CONDUCTIVE VIA

(75) Inventors: Lionel Chien Hui Tay, Singapore (SG); Guruprasad G. Badakere, Singapore (SG); Zigmund R. Camacho, Singapore (SG)

(73) Assignee: STATS ChipPAC, Ltd., Singapore (SG)

( * ) Notice: Subject to any disclaimer, the term of this patent is extended or adjusted under 35 U.S.C. 154(b) by 225 days.

(21) Appl. No.: 12/173,504

(22) Filed: Jul. 15, 2008

(65) Prior Publication Data

US 2010/0013102 A1    Jan. 21, 2010

(51) Int. Cl.
*H01L 21/4763* (2006.01)
(52) U.S. Cl. ............... 438/637; 438/622; 438/584; 257/720
(58) Field of Classification Search ............... None
See application file for complete search history.

(56) References Cited

U.S. PATENT DOCUMENTS

| | | | |
|---|---|---|---|
| 5,600,541 A * | 2/1997 | Bone et al. ............ | 361/707 |
| 6,507,115 B1 * | 1/2003 | Hofstee et al. ............ | 257/777 |
| 7,271,479 B2 | 9/2007 | Zhao et al. | |
| 2008/0001283 A1 | 1/2008 | Lee et al. | |
| 2008/0116588 A1 * | 5/2008 | Van Kleef et al. ............ | 257/779 |

* cited by examiner

*Primary Examiner*—Jarrett J Stark
*Assistant Examiner*—Nicholas Tobergte
(74) *Attorney, Agent, or Firm*—Robert D. Atkins (57) ABSTRACT

A semiconductor device has a conductive via formed around a perimeter of the semiconductor die. First and second conductive layers are formed on opposite sides of the semiconductor die and thermally connected to the conductive via. An insulating layer is formed over the semiconductor die. A portion of the insulating layer is removed to expose the first conductive layer and a thermal dissipation region of semiconductor die. A thermal via is formed through the insulating layer to the first conductive layer. A thermally conductive layer is formed over the thermal dissipation region and thermal via. A thermal conduction path is formed from the thermal dissipation region through the thermally conductive layer, thermal via, first conductive layer, conductive via, and second conductive layer. The thermal conduction path terminates in an external thermal ground point. The thermally conductive layer provides shielding for electromagnetic interference.

19 Claims, 5 Drawing Sheets

FIG. 4

SEMICONDUCTOR DEVICE AND METHOD OF PROVIDING A THERMAL DISSIPATION PATH THROUGH RDL AND CONDUCTIVE VIA

FIELD OF THE INVENTION

The present invention relates in general to semiconductor devices and, more particularly, to a semiconductor device having a thermal dissipation path through RDL and conductive via.

BACKGROUND OF THE INVENTION

Semiconductor devices are found in many products in the fields of entertainment, communications, networks, computers, and household markets. Semiconductor devices are also found in military, aviation, automotive, industrial controllers, and office equipment. The semiconductor devices perform a variety of electrical functions necessary for each of these applications.

The manufacture of semiconductor devices involves formation of a wafer having a plurality of die. Each semiconductor die contains hundreds or thousands of transistors and other active and passive devices performing a variety of electrical functions. For a given wafer, each die from the wafer typically performs the same electrical function. Front-end manufacturing generally refers to formation of the semiconductor devices on the wafer. The finished wafer has an active side containing the transistors and other active and passive components. Back-end manufacturing refers to cutting or singulating the finished wafer into the individual die and then packaging the die for structural support and environmental isolation.

One goal of semiconductor manufacturing is to produce a package suitable for faster, reliable, smaller, and higher-density integrated circuits (IC) at lower cost. Flip chip packages or wafer level chip scale packages (WLCSP) are ideally suited for ICs demanding high speed, high density, and greater pin count. Flip chip style packaging involves mounting the active side of the die face down toward a chip carrier substrate or printed circuit board (PCB). The electrical and mechanical interconnect between the active devices on the die and conduction tracks on the carrier substrate is achieved through a solder bump structure comprising a large number of conductive solder bumps or balls. The solder bumps are formed by a reflow process applied to solder material deposited on contact pads, which are disposed on the semiconductor substrate. The solder bumps are then soldered to the carrier substrate. The flip chip semiconductor package provides a short electrical conduction path from the active devices on the die to the carrier substrate in order to reduce signal propagation, lower capacitance, and achieve overall better circuit performance.

Semiconductor devices inherently generate heat during normal operation. Excessive heat build-up can adversely affect the operation of the device and shorten its longevity. Heat sinks have been used for thermal dissipation. However, conventional heat sinks require dedicated structures to form the thermal conduction path to dissipate the heat. These thermal conduction structures add to the cost and size of the semiconductor package.

SUMMARY OF THE INVENTION

A need exists to dissipate heat from a semiconductor device. Accordingly, in one embodiment, the present invention is a method of making a semiconductor device comprising the steps of providing a semiconductor die, forming first and second conductive vias around a perimeter of the semiconductor die, and forming first and second conductive layers on a front side of the semiconductor die. The first conductive layer is electrically connected between the first conductive via and a contact pad of the semiconductor die. The second conductive layer is thermally connected to the second conductive via. The method further includes the step of forming third and fourth conductive layers on a backside of the semiconductor die opposite the front side of the semiconductor die. The third conductive layer is electrically connected to the first conductive via. The fourth conductive layer is thermally connected to the second conductive via. The method further includes the steps of forming an insulating layer over the semiconductor die, removing a portion of the insulating layer to expose the first and second conductive layers and a thermal dissipation region of semiconductor die, forming a thermal via through the insulating layer to the second conductive layer, and forming a thermally conductive layer over the insulating material and thermal dissipation region and thermal via.

In another embodiment, the present invention is a method of making a semiconductor device comprising the steps of providing a semiconductor die, forming a conductive via around a perimeter of the semiconductor die, and forming a first conductive layer on a front side of the semiconductor die. The first conductive layer is thermally connected to the conductive via. The method further includes the step of forming a second conductive layer on a backside of the semiconductor die opposite the front side of the semiconductor die. The second conductive layer is thermally connected to the conductive via. The method further includes the steps of forming an insulating layer over the semiconductor die, removing a portion of the insulating layer to expose a thermal dissipation region of semiconductor die, forming a thermal via through the insulating layer to the first conductive layer, and forming a thermally conductive layer over the thermal dissipation region and thermal via.

In another embodiment, the present invention is a method of making a semiconductor device comprising the steps of providing a semiconductor die, forming a conductive via around a perimeter of the semiconductor die, and forming a first conductive layer on a front side of the semiconductor die. The first conductive layer is thermally connected to the conductive via. The method further includes the step of forming a thermally conductive layer over a thermal dissipation region of the semiconductor die. The semiconductor die has a thermal dissipation path from the thermal dissipation region through the thermally conductive layer, first conductive layer, and conductive via.

In another embodiment, the present invention is a semiconductor device comprising a semiconductor die and conductive via formed around a perimeter of the semiconductor die. A first conductive layer is formed on a front side of the semiconductor die. The first conductive layer is thermally connected to the conductive via. A thermally conductive layer is formed over a thermal dissipation region of the semiconductor die. The semiconductor die has a thermal dissipation path through the thermally conductive layer, first conductive layer, and conductive via.

DETAILED DESCRIPTION OF THE DRAWINGS

The present invention is described in one or more embodiments in the following description with reference to the Figures, in which like numerals represent the same or similar elements. While the invention is described in terms of the best mode for achieving the invention's objectives, it will be appreciated by those skilled in the art that it is intended to cover alternatives, modifications, and equivalents as may be included within the spirit and scope of the invention as defined by the appended claims and their equivalents as supported by the following disclosure and drawings.

The manufacture of semiconductor devices involves formation of a wafer having a plurality of die. Each die contains hundreds or thousands of transistors and other active and passive devices performing one or more electrical functions. For a given wafer, each die from the wafer typically performs the same electrical function. Front-end manufacturing generally refers to formation of the semiconductor devices on the wafer. The finished wafer has an active side containing the transistors and other active and passive components. Back-end manufacturing refers to cutting or singulating the finished wafer into the individual die and then packaging the die for structural support and/or environmental isolation.

A semiconductor wafer generally includes an active surface having semiconductor devices disposed thereon, and a backside surface formed with bulk semiconductor material, e.g., silicon. The active side surface contains a plurality of semiconductor die. The active surface is formed by a variety of semiconductor processes, including layering, patterning, doping, and heat treatment. In the layering process, semiconductor materials are grown or deposited on the substrate by techniques involving thermal oxidation, nitridation, chemical vapor deposition, evaporation, and sputtering. Photolithography involves the masking of areas of the surface and etching away undesired material to form specific structures. The doping process injects concentrations of dopant material by thermal diffusion or ion implantation.

Figure 1:
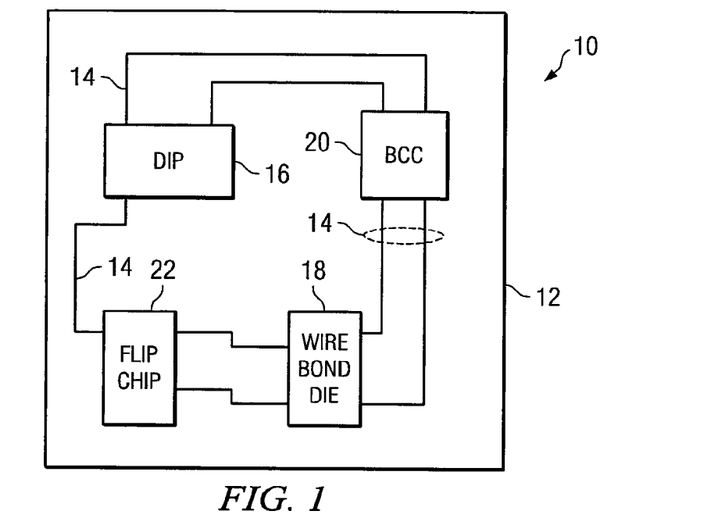
FIG. 1 illustrates a PCB with different types of packages mounted to its surface.

FIG. 1 illustrates electronic device 10 having a chip carrier substrate or printed circuit board (PCB) 12 with a plurality of semiconductor packages or semiconductor die mounted on its surface. Electronic device 10 may have one type of semiconductor package, or multiple types of semiconductor packages, depending on the application. The different types of semiconductor packages are shown in FIG. 1 for purposes of illustration.

Electronic device 10 may be a stand-alone system that uses the semiconductor packages to perform an electrical function. Alternatively, electronic device 10 may be a subcomponent of a larger system. For example, electronic device 10 may be a graphics card, network interface card, or other signal processing card that can be inserted into a computer. The semiconductor package can include microprocessors, memories, application specific integrated circuits (ASICs), logic circuits, analog circuits, radio frequency (RF) circuits, discrete devices, or other semiconductor die or electrical components.

In FIG. 1, PCB 12 provides a general substrate for structural support and electrical interconnect of the semiconductor packages and other electronic components mounted on the PCB. Conductive signal traces 14 are formed on a surface or within layers of PCB 12 using evaporation, electrolytic plating, electroless plating, screen printing, or other suitable metal deposition process. Signal traces 14 provide for electrical communication between each of the semiconductor packages, mounted components, and any connected external system components. Traces 14 also provide power and ground connections to each of the semiconductor packages.

For the purpose of illustration, several types of semiconductor packages, including a dual in-line package (DIP) 16, wire-bonded die 18, bump chip carrier (BCC) 20, and flip chip package 22, are shown mounted on PCB 12. Depending upon the system requirements, any combination of semiconductor packages or other electronic components can be connected to PCB 12. In some embodiments, electronic device 10 includes a single attached semiconductor package, while other embodiments call for multiple interconnected packages. By combining one or more semiconductor packages over a single substrate, manufacturers can incorporate premade components into electronic devices and systems. Because the semiconductor packages include sophisticated functionality and represent known good units (KGUs), electronic devices can be manufactured using cheaper components and shorten the manufacturing process. The resulting devices are less likely to fail and less expensive to manufacture resulting in lower costs for consumers.

Figure 2A:
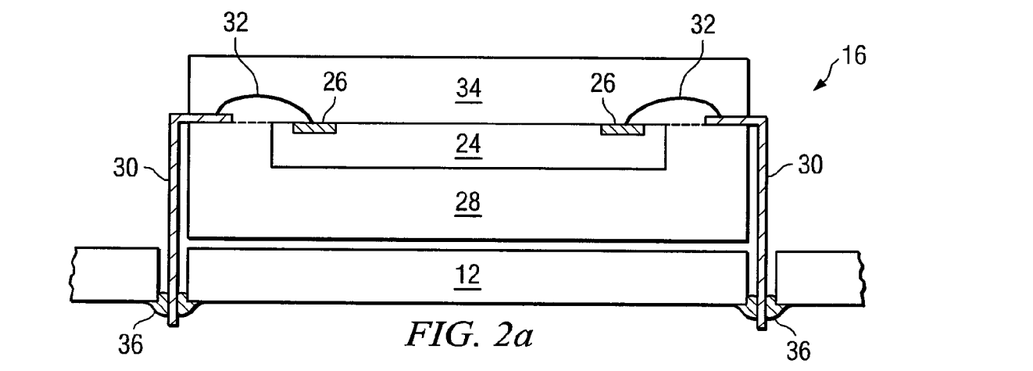
FIGS. 2a-2d illustrate further detail of the semiconductor packages mounted to the PCB.

FIG. 2a illustrates further detail of DIP 16 mounted on PCB 12. DIP 16 includes semiconductor die 24 having contact pads 26. Semiconductor die 24 includes an active area containing analog or digital circuits implemented as active devices, passive devices, conductive layers, and dielectric layers formed within semiconductor die 24 and are electrically interconnected according to the electrical design of the die. For example, the circuit may include one or more transistors, diodes, inductors, capacitors, resistors, and other circuit elements formed within the active area of die 24. Contact pads 26 are made with a conductive material such as aluminum (Al), copper (Cu), tin (Sn), nickel (Ni), gold (Au), or silver (Ag), and are electrically connected to the circuit elements formed within die 24. Contact pads 26 are formed by a physical vapor deposition (PVD), chemical vapor deposition (CVD), electrolytic plating, or electroless plating process. During assembly of DIP 16, semiconductor die 24 is mounted to a die attach area of lower portion 28 of the package body using a gold-silicon eutectic layer or adhesive material, such as thermal epoxy. The package body includes an insulative packaging material such as plastic or ceramic. Conductor leads 30 are connected to lower portion 28 of the body and bond wires 32 are formed between leads 30 and contact pads 26 of die 24. An encapsulant 34 is deposited over the package for environmental protection by preventing moisture and particles from entering the package and contaminating die 24, contact pads 26, or bond wires 32. DIP 16 is connected to PCB 12 by inserting leads 30 into holes formed through PCB 12. Solder material 36 is flowed around leads 30 and into the holes to physically and electrically connect DIP 16 to PCB 12. Solder material 36 can be metal or electrically conductive material, e.g., Sn, lead (Pb), Au, Ag, Cu, zinc (Zn), bismuthinite (Bi), and alloys thereof, with an optional flux material. For example, the solder material can be eutectic Sn/Pb, high lead, or lead free.

Figure 2B:
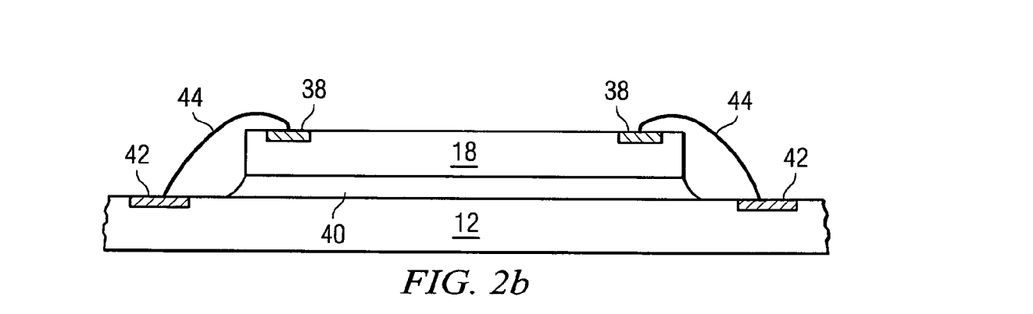

Referring to FIG. 2b, a wire-bonded die 18 having contact pads 38 is mounted to PCB 12 using adhesive material 40. Contact pads 42 are formed on the surface of PCB 12 and electrically connect to one or more traces 14 formed on or within the layers of PCB 12. Bond wires 44 are formed between contact pads 38 of die 18 and contact pads 42 of PCB 12.

Figure 2C:
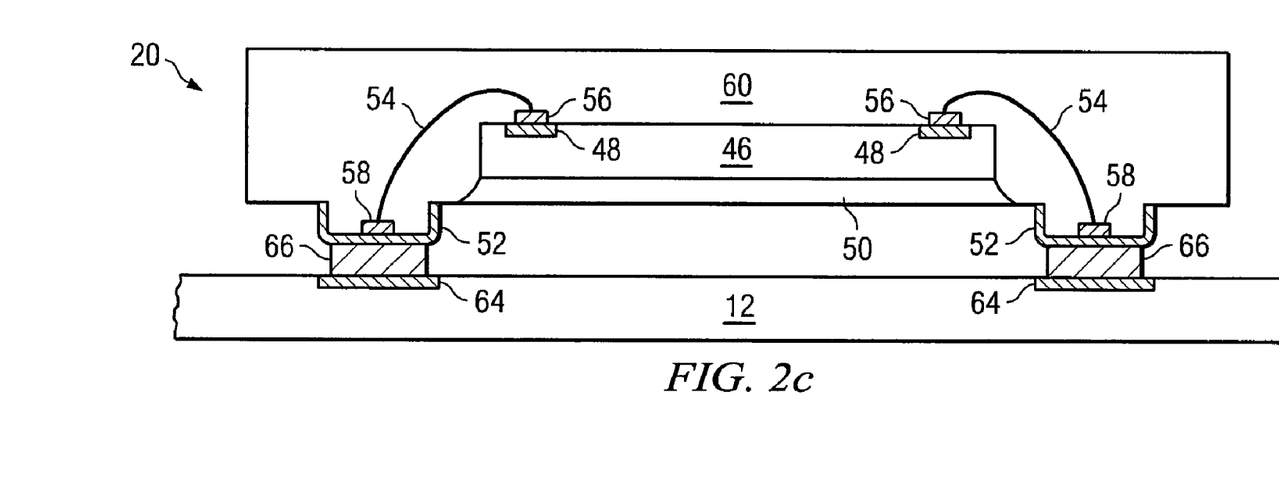

FIG. 2c illustrates further detail of BCC 20 with an incorporated semiconductor die, integrated circuit (IC), or combination thereof. Semiconductor die 46 having contact pads 48 is mounted over a carrier using an underfill or epoxy-resin adhesive material 50. Semiconductor die 46 includes an active area containing analog or digital circuits implemented as active devices, passive devices, conductive layers, and dielectric layers formed within semiconductor die 46 and are electrically interconnected according to the electrical design of the die. For example, the circuit may include one or more transistors, diodes, inductors, capacitors, resistors, and other circuit elements formed within the active area of die 46. Contact pads 48 are connected to the electrical devices and circuitry formed within the active area of die 46. Bond wires 54 and bond pads 56 and 58 electrically connect contact pads 48 of die 46 to contact pads 52 of BCC 20. Mold compound or encapsulant 60 is deposited over die 46, bond wires 54 and contact pads 52 to provide physical support and electrical insulation for the device. Contact pads 64 are formed on PCB 12 and electrically connect to one or more conductive signal traces 14. Solder material is deposited between contact pads 52 of BCC 20 and contact pads 64 of PCB 12. The solder material is reflowed to form bumps 66 which form a mechanical and electrical connection between BCC 20 and PCB 12.

Figure 2D:
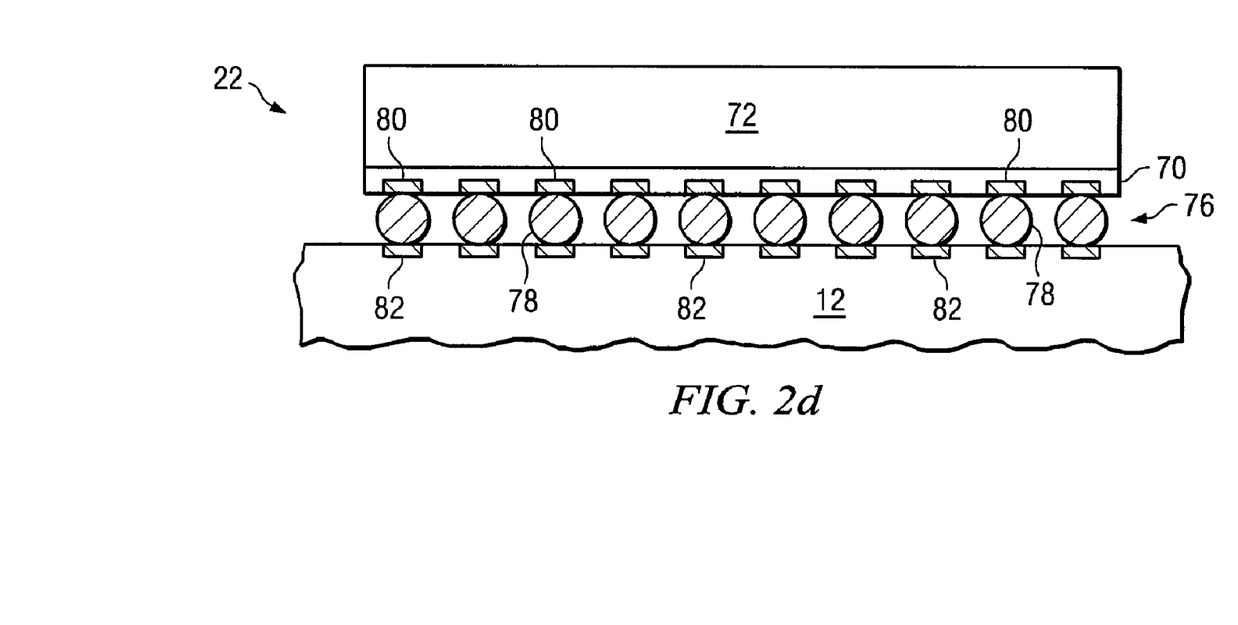

In FIG. 2d, flip chip style semiconductor device 22 has a semiconductor die 72 with active area 70 mounted face down toward PCB 12. Active area 70 containing analog or digital circuits implemented as active devices, passive devices, conductive layers, and dielectric layers formed within semiconductor die 72, is electrically interconnected according to the electrical design of the die. For example, the circuit may include one or more transistors, diodes, inductors, capacitors, resistors, and other circuit elements formed within active area 70 of die 72. The electrical and mechanical interconnect is achieved through solder bump structure 76 comprising a large number of individual conductive solder bumps or balls 78. The solder bumps are formed on bump pads or interconnect sites 80, which are disposed on active area 70. The bump pads 80 connect to the active circuits by conduction tracks in active area 70. The solder bumps 78 are electrically and mechanically connected to contact pads or interconnect sites 82 on PCB 12 by a solder reflow process. The interconnect sites 82 are electrically connected to one or more conductive signal traces 14 on PCB 12. The flip chip semiconductor device provides a short electrical conduction path from the active devices on die 72 to conduction tracks on PCB 12 in order to reduce signal propagation distance, lower capacitance, and achieve overall better circuit performance.

Figure 3A:
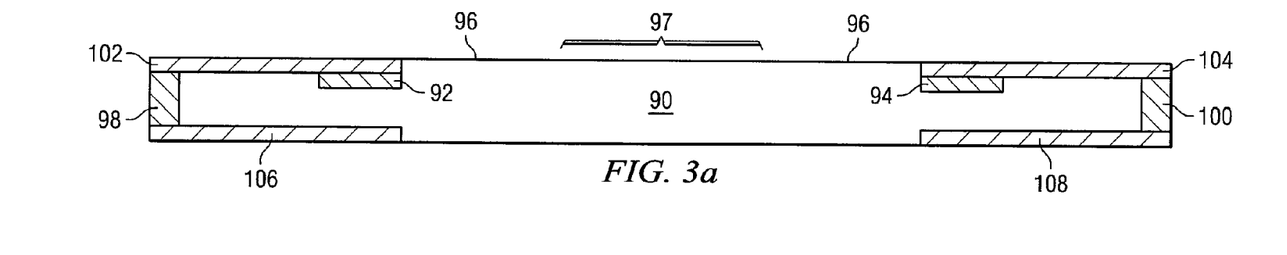
FIGS. 3a-3d illustrate a process of forming a thermal conduction path for a semiconductor device through an RDL and conductive via.

FIGS. 3a-3d illustrate a process of forming a thermal conduction path through an RDL and conductive via on a semiconductor die. To start the process, a plurality of semiconductor die is formed on a semiconductor wafer using conventional integrated circuit processes, as described above. FIG. 3a shows a semiconductor die 90 with contact pads 92 and 94 formed on active surface 96. The active surface contains analog or digital circuits implemented as active devices, passive devices, conductive layers, and dielectric layers formed within semiconductor die 90 and electrically interconnected according to the electrical design of the die. Semiconductor die 90 has no electrical circuit components exposed to the top surface in region 97, which is reserved for thermal dissipation.

A plurality of vias or openings is formed around a perimeter of semiconductor die 90 using a drilling or etching process. Alternatively, the vias or openings can be formed in a peripheral region around the die. The wafer is mounted to an expansion table and the die are diced through the saw streets. The expansion table moves in a two-dimensional direction to create a gap around the die. An organic insulating material is deposited into the gap to make a base to create the openings.

An electrically conductive material, with optional seed layer, is deposited in the openings to form conductive vias 98 and 100. The conductive material can be Al, Cu, Sn, Ni, Au, or Ag. The seed layer can be Cu, Ni, nickel vanadium (NiV), Au, or Al. The seed layer and conductive material are patterned and deposited using electrolytic plating, electroless plating, sputtering, PVD, CVD, or other suitable metal deposition process.

An electrically and thermally conductive layer is patterned and deposited on active surface 96 and contact pads 92 and 94 of semiconductor die 90 to form redistribution layers (RDL) 102 and 104. RDL 102 electrically connects contact pad 92 to conductive via 98. RDL 104 thermally connects contact pad 94 to conductive via 100. An electrically conductive layer is patterned and deposited on a backside of semiconductor die 90, opposite active surface 96, to form RDLs 106 and 108. RDL 106 electrically connects to conductive via 98, and RDL 108 thermally connects to conductive via 100. RDLs 102-108 are formed using evaporation, electrolytic plating, electroless plating, or other suitable metal deposition process. RDLs 102-108 can be Al, Cu, Sn, Ni, Au, Ag, or other suitable conductive material.

Figure 3B:
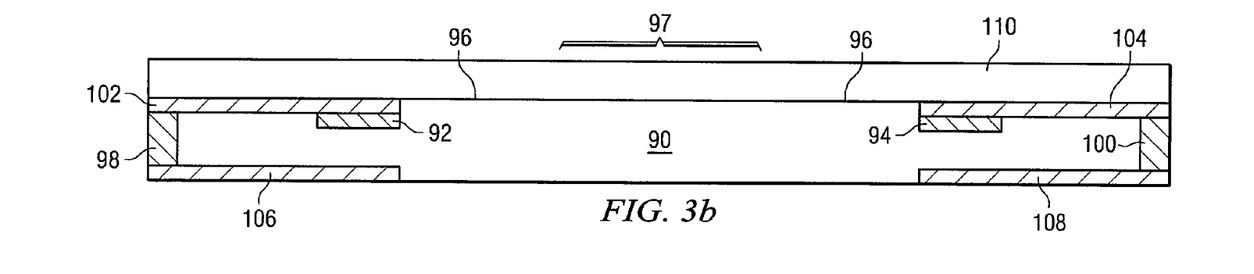

In FIG. 3b, a passivation layer 110 is deposited over semiconductor die 90 and RDLs 102 and 104. Passivation layer 110 can be silicon dioxide (SiO2), silicon nitride (Si3N4), silicon oxynitride (SiON), tantalum pentoxide (Ta2O5), aluminum oxide (Al2O3), polyimide (PI), benzocyclobutene (BCB), polybenzoxazole (PBO), or other suitable material having insulating properties.

Figure 3C:
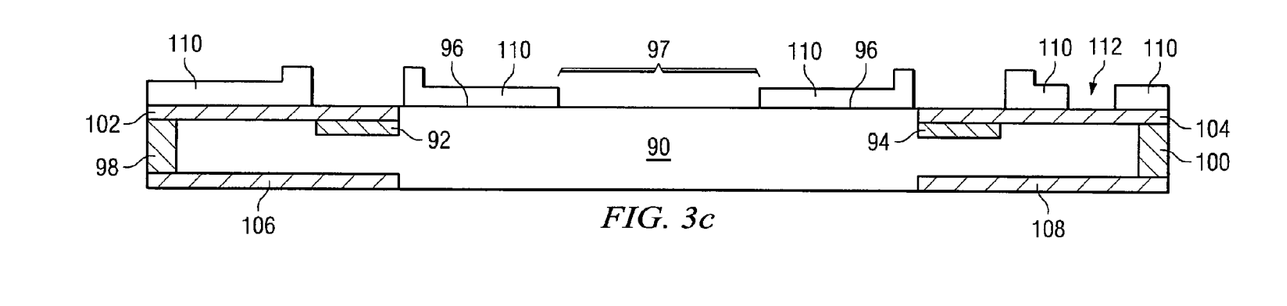

In FIG. 3c, a portion of passivation layer 110 is removed by a patterning and etching process to expose thermal dissipation region 97 and further expose a portion of RDLs 102 and 104 over contact pads 92 and 94. The etching process also creates thermal via 112 which extends down to a portion of RDL 104 away from contact pad 94.

Figure 3D:
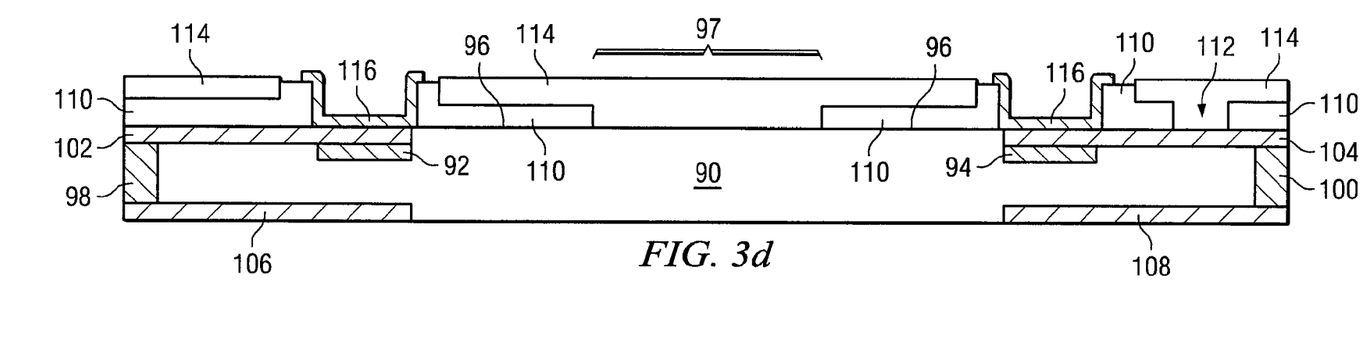

In FIG. 3d, a thermally conductive layer 114 is patterned and deposited over thermal dissipation region 97, passivation layer 110, and thermal via 112. The thermally conductive layer 114 is formed using evaporation, electrolytic plating, electroless plating, sputtering, or other suitable metal deposition process. The layer 114 can be Cu, Al, Au, Ag, or other thermally conductive material. Semiconductor die 90 inherently generates heat during normal operation. The thermally conductive layer 114 disposed over semiconductor die 90 operates as a heat sink for the die. Region 97 provides a central thermal dissipation area for the die. Thus, the physical contact between thermally conductive layer 114 and thermal dissipation region 97 provides a thermal conduction path for heat dissipation from semiconductor die 90. The thermal conduction path continues through thermal via 112, RDL 104, conductive via 100, and RDL 108.

An electrically conductive layer 116 is deposited on the exposed portion of RDLs 102 and 104 over contact pads 92 and 94. Conductive layer 116 is an under bump metallization (UBM) in electrical contact with RDLs 102 and 104. UBMs 116 can be a multiple metal stack with adhesion layer, barrier layer, and seed or wetting layer. The adhesion layer is formed over RDLs 102 and 104 and can be titanium (Ti), or titanium nitride (TiN), titanium tungsten (TiW), Al, or chromium (Cr).

The barrier layer is formed over the adhesion layer and can be made of Ni, NiV, platinum (Pt), palladium (Pd), TiW, or chromium copper (CrCu). The barrier layer inhibits the diffusion of Cu into the active area of the die. The seed layer can be Cu, Ni, NiV, Au, or Al. The seed layer is formed over the barrier layer and acts as an intermediate conductive layer between RDLs 102 and 104 and subsequent solder bumps or other interconnect structure. UBMs 116 provide a low resistive interconnect to RDLs 102 and 104 as well as a barrier to solder diffusion and seed layer for solder wettability.

Figure 4:
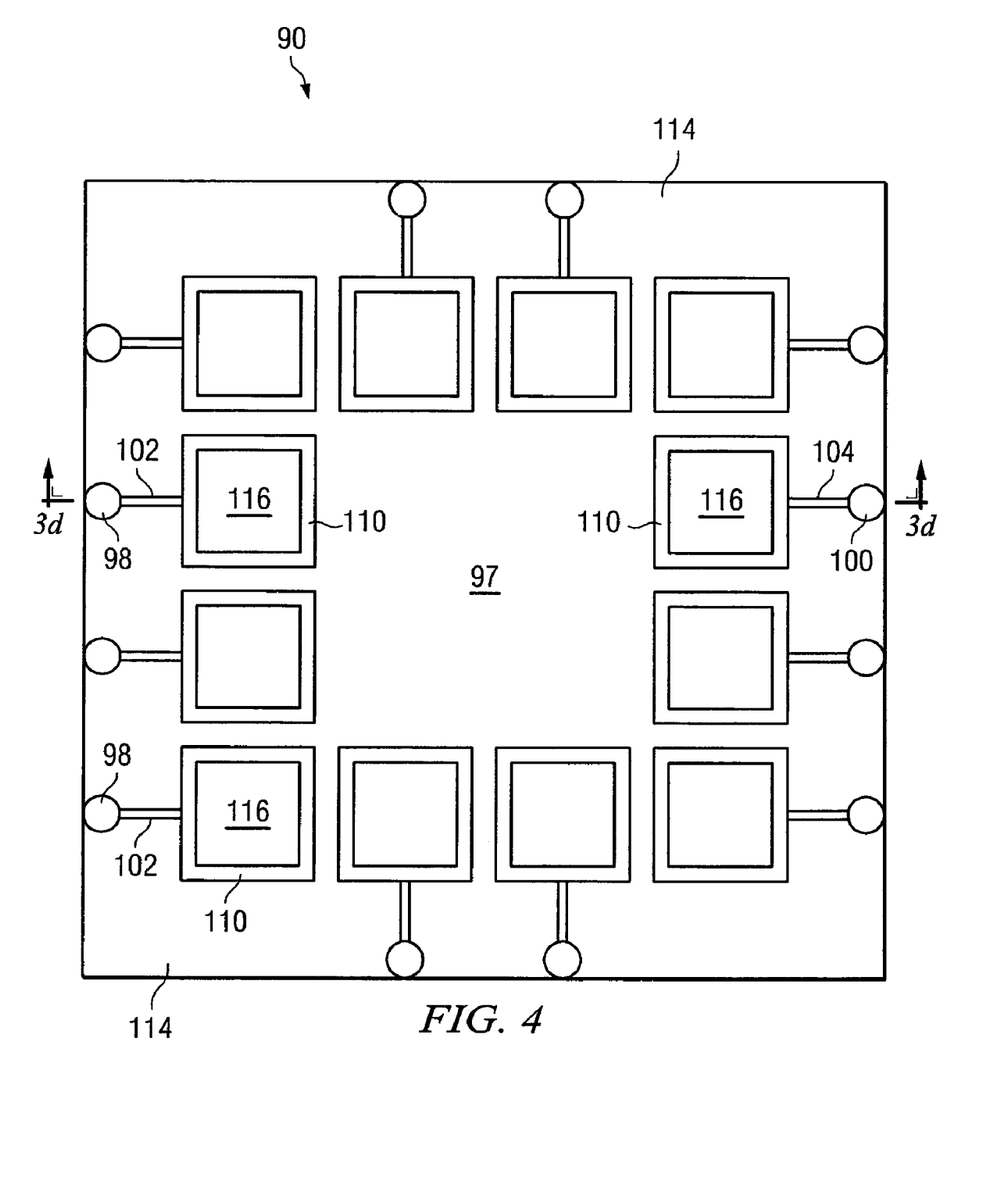
FIG. 4 is a top view of the thermally conductive layer disposed over the semiconductor die.

FIG. 4 is a top view of the structure described in FIGS. 3a-3d. Conductive vias 98 and 100 are shown around the perimeter of semiconductor die 90. The thermally conductive layer or heat sink 114 occupies a top surface area of semiconductor die 90 in central thermal dissipation region 97, and further in and around UBMs 116 and conductive vias 98 and 100 for heat dissipation. The thermally conductive layer 114 also provides an electromagnetic interference (EMI) shield for semiconductor die 90.

Figure 5:
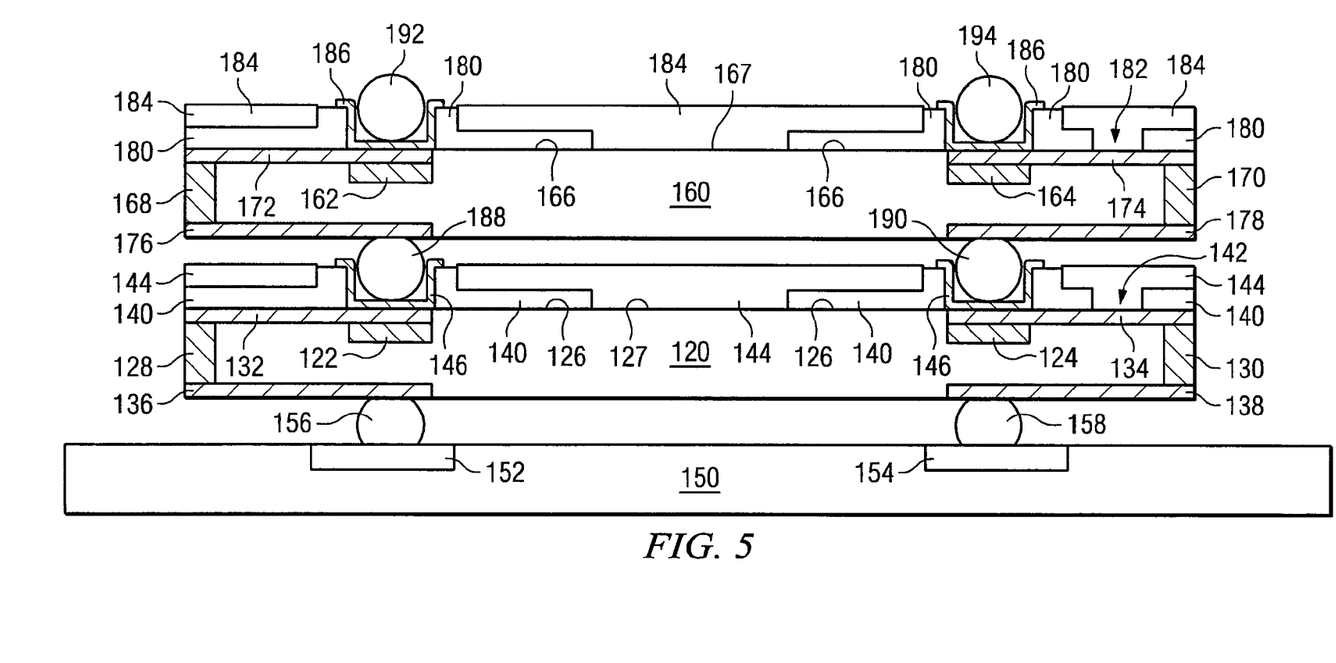
FIG. 5 illustrates stacked semiconductor die with a thermal conduction path through RDL and conductive via.

FIG. 5 shows stacked semiconductor die, each formed similar to semiconductor die 90 in FIGS. 3a-3d. Semiconductor die 120 with contact pads 122 and 124 formed on active surface 126. The active surface contains analog or digital circuits implemented as active devices, passive devices, conductive layers, and dielectric layers formed within semiconductor die 120 and electrically interconnected according to the electrical design of the die. Semiconductor die 120 has no electrical circuit components exposed to the top surface in region 127, which is reserved for thermal dissipation.

A plurality of electrically conductive vias 128 and 130 are formed around a perimeter of semiconductor die 120. RDL 132 electrically connects contact pad 122 to conductive via 128. RDL 134 thermally connects contact pad 124 to conductive via 130. RDL 136 electrically connects to conductive via 128, and RDL 138 thermally connects to conductive via 130. A passivation layer 140 is disposed over semiconductor die 120 and then etched to expose thermal dissipation region 127 and a portion of RDLs 132 and 134 over contact pads 122 and 124. The passivation layer 140 also forms thermal via 142 over RDL 134.

A thermally conductive layer 144 is formed over thermal dissipation region 127, passivation layer 140, and thermal via 142. Semiconductor die 120 inherently generates heat during normal operation. The thermally conductive layer 144 disposed over semiconductor die 120 operates as a heat sink for the die. Region 127 provides a central thermal dissipation area for the die. Thus, the physical contact between thermally conductive layer 144 and thermal dissipation region 127 provides a thermal conduction path for heat dissipation from semiconductor die 120. The thermal conduction path continues through thermal via 142, RDL 134, conductive via 130, and RDL 138. The thermally conductive layer 144 also provides an EMI shield for semiconductor die 120. UBMs 146 are formed on RDLs 132 and 134 over contact pads 122 and 124.

Semiconductor die 120 is mounted to substrate or printed circuit board (PCB) 150. PCB 150 has contact pads 152 and 154 electrically connected to signal track within the layers of the PCB for external connectivity. Contact pad 154 electrically connects to a thermal ground point. An electrically conductive solder material is deposited on contact pads 152 and 154 using evaporation, electrolytic plating, electroless plating, ball drop, or screen printing process. The solder material can be metal or electrically conductive material, e.g., Sn, Ni, Au, Ag, Pb, Bi, and alloys thereof. For example, the solder material can be eutectic Sn/Pb, high lead, or lead free. The solder material is reflowed by heating the solder material above its melting point to form spherical balls or bumps 156 and 158. In some applications, solder bumps 156 and 158 are reflowed a second time to improve electrical contact to contact pads 152 and 154. Solder bumps 156 and 158 are metallurgically and electrically connected to RDLs 136 and 138 of semiconductor die 120, respectively.

Semiconductor die 160 with contact pads 162 and 164 formed on active surface 166. The active surface contains analog or digital circuits implemented as active devices, passive devices, conductive layers, and dielectric layers formed within semiconductor die 160 and electrically interconnected according to the electrical design of the die. Semiconductor die 160 has no electrical circuit components exposed to the top surface in region 167, which is reserved for thermal dissipation.

A plurality of electrically conductive vias 168 and 170 are formed around a perimeter of semiconductor die 160. RDL 172 electrically connects contact pad 162 to conductive via 168. RDL 174 thermally connects contact pad 164 to conductive via 170. RDL 176 electrically connects to conductive via 168, and RDL 178 thermally connects to conductive via 170. A passivation layer 180 is disposed over semiconductor die 160 and then etched to expose thermal dissipation region 167 and a portion of RDLs 172 and 174 over contact pads 162 and 164. The passivation layer 180 also forms thermal via 182 over RDL 174.

A thermally conductive layer 184 is formed over thermal dissipation region 167, passivation layer 180, and thermal via 182. Semiconductor die 160 inherently generates heat during normal operation. The thermally conductive layer 184 disposed over semiconductor die 160 operates as a heat sink for the die. Region 167 provides a central thermal dissipation area for the die. Thus, the physical contact between thermally conductive layer 184 and thermal dissipation region 167 provides a thermal conduction path for heat dissipation from semiconductor die 160. The thermal conduction path continues through thermal via 182, RDL 174, conductive via 170, and RDL 178. The thermally conductive layer 184 also provides an EMI shield for semiconductor die 160. UBMs 186 are formed on RDLs 172 and 174 over contact pads 162 and 164.

Semiconductor die 160 is mounted to semiconductor die 120. An electrically conductive solder material is deposited on UBMs 146 of semiconductor die 120. The solder material is reflowed by heating the solder material above its melting point to form spherical balls or bumps 188 and 190. Solder bumps 188 and 190 are metallurgically and electrically connected to RDLs 176 and 178 of semiconductor die 160, respectively. Solder bumps 192 and 194 can be formed on UBMs 186 for additional electrical interconnection.

The thermally conductive layers 144 and 184 each provide a thermal conduction path for heat dissipation from semiconductor die 120 and 160, respectively. The thermal conduction path for thermal dissipation region 127 passes through thermally conductive layer 144, thermal via 142, RDL 134, conductive via 130, RDL 138, solder bump 158, and contact pad 154 to a thermal ground point. The thermal conduction path for thermal dissipation region 167 passes through thermally conductive layer 184, thermal via 182, RDL 174, conductive via 170, RDL 178, solder bump 190, and UBM 146 to RDL 134. The thermal conduction path for thermal dissipation region 167 then continues through the thermal conduction path for thermal dissipation region 127. Accordingly, the thermal conduction path for semiconductor die 120 and 160 use RDLs 134, 138, 174, and 178 and conductive vias 130 and 170 thermally grounded through contact pad 154.

The electrical signal conduction path for semiconductor die 120 passes through contact pad 122, RDL 132, conductive via 128, RDL 136, and solder bump 156 to contact pad 152 of PCB 150. The electrical signal conduction path for semiconductor die 160 passes through contact pad 162, RDL 172, conductive via 168, RDL 176, and solder bump 188 to UBM 146 of semiconductor die 120. The electrical signal conduction path for semiconductor die 160 then continues through the electrical signal conduction path for semiconductor die 120. The electrical conduction path for semiconductor die 120 and 160 use RDLs 132, 136, 172, and 176 and conductive vias 128 and 168 electrically connected to contact pad 152. Consequently, semiconductor die 120 and 160 have separate thermal conduction paths and electrical signal conduction paths.

While one or more embodiments of the present invention have been illustrated in detail, the skilled artisan will appreciate that modifications and adaptations to those embodiments may be made without departing from the scope of the present invention as set forth in the following claims.

What is claimed:

1. A method of making a semiconductor device, comprising:
    providing a semiconductor die;
    forming first and second conductive vias around a perimeter of the semiconductor die;
    forming first and second conductive layers on a front side of the semiconductor die, the first conductive layer being electrically connected between the first conductive via and a contact pad of the semiconductor die, the second conductive layer being thermally connected to the second conductive via;
    forming third and fourth conductive layers on a backside of the semiconductor die opposite the front side of the semiconductor die, the third conductive layer being electrically connected to the first conductive via, the fourth conductive layer being thermally connected to the second conductive via;
    forming an insulating layer over the semiconductor die;
    removing a portion of the insulating layer to expose the first and second conductive layers and a thermal dissipation region of semiconductor die;
    forming a thermal via through the insulating layer to the second conductive layer; and
    forming a thermally conductive layer over the insulating material and thermal dissipation region and thermal via.

2. The method of claim 1, further including forming an under bump metallization over the first and second conductive layers.

3. The method of claim 1, further including forming a thermal conduction path from the thermal dissipation region through the thermally conductive layer, thermal via, second conductive layer, second conductive via, and fourth conductive layer.

4. The method of claim 1, further including forming an electrical conduction path from the contact pad through the first conductive layer, first conductive via, and third conductive layer.

5. The method of claim 1, wherein the thermally conductive layer provides shielding for electromagnetic interference.

6. The method of claim 1, further including:
    stacking a plurality of the semiconductor die; and
    forming a thermal conduction path from the thermal dissipation region through the thermally conductive layer, thermal via, second conductive layer, second conductive via, and fourth conductive layer of each semiconductor die.

7. The method of claim 1, further including:
    providing a substrate having a thermal ground point;
    mounting the semiconductor die to the substrate; and
    thermally connecting the fourth conductive layer to the thermal ground point.

8. A method of making a semiconductor device, comprising:
    providing a semiconductor die;
    forming a conductive via around a perimeter of the semiconductor die;
    forming a first conductive layer on a front side of the semiconductor die, the first conductive layer being thermally connected to the conductive via;
    forming a second conductive layer on a backside of the semiconductor die opposite the front side of the semiconductor die, the second conductive layer being thermally connected to the conductive via;
    forming an insulating layer over the semiconductor die;
    removing a portion of the insulating layer to expose a thermal dissipation region of semiconductor die;
    forming a thermal via through the insulating layer to the first conductive layer; and
    forming a thermally conductive layer over the thermal dissipation region and thermal via.

9. The method of claim 8, further including forming an under bump metallization over the first conductive layer.

10. The method of claim 8, further including forming a thermal conduction path from the thermal dissipation region through the thermally conductive layer, thermal via, first conductive layer, conductive via, and second conductive layer.

11. The method of claim 8, wherein the thermal conductive layer provides shielding for electromagnetic interference.

12. The method of claim 8, further including:
    stacking a plurality of the semiconductor die; and
    forming a thermal conduction path from the thermal dissipation region through the thermally conductive layer, thermal via, first conductive layer, conductive via, and second conductive layer of each semiconductor die.

13. The method of claim 8, further including:
    providing a substrate having a thermal ground point;
    mounting the semiconductor die to the substrate; and
    thermally connecting the second conductive layer to the thermal ground point.

14. A method of making a semiconductor device, comprising:
    providing a semiconductor die;
    forming a conductive via around a perimeter of the semiconductor die;
    forming a first conductive layer on a front side of the semiconductor die, the first conductive layer being thermally connected to the conductive via; and
    forming a thermally conductive layer over a thermal dissipation region of the semiconductor die, the semiconductor die having a thermal dissipation path from the thermal dissipation region through the thermally conductive layer, first conductive layer, and conductive via.

15. The method of claim 14, further including:
    forming a second conductive layer on a backside of the semiconductor die opposite the front side of the semiconductor die, the second conductive layer being thermally connected to the conductive via;
    forming an insulating layer over the semiconductor die;
    removing a portion of the insulating layer to expose the thermal dissipation region of the semiconductor die;

forming a thermal via through the insulating layer to the first conductive layer; and forming the thermally conductive layer over the thermal dissipation region and thermal via.

16. The method of claim 15, further including:

providing a substrate having a thermal ground point;

mounting the semiconductor die to the substrate; and thermally connecting the second conductive layer to the thermal ground point.

17. The method of claim 14, further including forming an under bump metallization over the first conductive layer.

18. The method of claim 14, wherein the thermally conductive layer provides shielding for electromagnetic interference.

19. The method of claim 14, further including:

stacking a plurality of the semiconductor die; and forming a thermal conduction path from the thermal dissipation region through the thermally conductive layer, first conductive layer, and conductive via of each semiconductor die.

* * * * *